US012676200B2

(12) United States Patent
Lien et al.

(10) Patent No.: US 12,676,200 B2
(45) Date of Patent: Jul. 7, 2026

(54) SELECTIVE USE OF A WORD LINE MONITORING PROCEDURE FOR RELIABILITY-RISK WORD LINES

(71) Applicant: Micron Technology, Inc., Boise, ID (US)

(72) Inventors: Yu-Chung Lien, San Jose, CA (US); Ekamdeep Singh, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 18/757,422

(22) Filed: Jun. 27, 2024

(65) Prior Publication Data

US 2025/0014657 A1 Jan. 9, 2025

Related U.S. Application Data

(60) Provisional application No. 63/512,380, filed on Jul. 7, 2023.

(51) Int. Cl.
| | |
|---|---|
| *G11C 16/34* | (2006.01) |
| *G11C 11/56* | (2006.01) |
| *G11C 16/04* | (2006.01) |
| *G11C 16/08* | (2006.01) |
| *G11C 16/10* | (2006.01) |

(52) U.S. Cl.
CPC ...... *G11C 16/3459* (2013.01); *G11C 16/3418* (2013.01); *G11C 16/349* (2013.01); *G11C 11/5628* (2013.01); *G11C 16/0483* (2013.01); *G11C 16/08* (2013.01); *G11C 16/10* (2013.01)

(58) Field of Classification Search
CPC ............ G11C 16/3459; G11C 16/3418; G11C 16/349; G11C 11/5628; G11C 16/0483; G11C 16/08; G11C 16/10; G11C 16/3427
USPC ...................................................... 365/185.22
See application file for complete search history.

(56) References Cited

U.S. PATENT DOCUMENTS

| | | | | |
|---|---|---|---|---|
| 2009/0073796 A1* | 3/2009 | Ahsan | ...................... | G11C 5/02 |
| | | | | 365/230.06 |
| 2013/0170301 A1* | 7/2013 | Kochar | .................. | G11C 29/06 |
| | | | | 365/185.18 |
| 2016/0005463 A1* | 1/2016 | Park | ................... | G11C 13/0021 |
| | | | | 365/148 |
| 2019/0006021 A1* | 1/2019 | Ghai | ................... | G11C 11/5628 |
| 2022/0051738 A1* | 2/2022 | Lee | ..................... | G11C 29/4401 |
| 2023/0124035 A1* | 4/2023 | Li | ...................... | G11C 29/4401 |
| | | | | 711/154 |
| 2023/0315330 A1* | 10/2023 | Li | ........................ | G06F 3/0655 |
| 2023/0377646 A1* | 11/2023 | di Vincenzo | ....... | G11C 13/0028 |
| 2023/0395135 A1* | 12/2023 | Bedeschi | ............... | G11C 16/28 |

(Continued)

*Primary Examiner* — Ly D Pham
(74) *Attorney, Agent, or Firm* — Harrity & Harrity, LLP

(57) ABSTRACT

In some implementations, a memory device may receive, from a host device, a single-level cell (SLC) program command instructing host data to be written to one or more subblocks of memory. The memory device may determine whether a word line associated with a subblock, of the one or more subblocks, is associated with a reliability risk. The memory device may determine whether to perform a word line leakage monitoring procedure associated with a programming scheme to be used to program the subblock based on whether the word line is associated with the reliability risk.

20 Claims, 10 Drawing Sheets

(56) References Cited

U.S. PATENT DOCUMENTS

| 2024/0006010 A1* | 1/2024 | Tian | G11C 29/4401 |
| 2024/0036753 A1* | 2/2024 | Chin | G06F 3/0653 |

* cited by examiner

428~

| PEC Thresh | Failed WL |
|------------|-----------|
| PEC_1 | WL_A |
| PEC_2 | WL_B |
| PEC_3 | WL_C |
| PEC_4 | WL_D |
| PEC_5 | WL_E |
| PEC_6 | WL_F |
| PEC_7 | WL_G |
| PEC_8 | WL_H |
| PEC_9 | WL_I |
| PEC_10 | WL_J |
| PEC_11 | WL_K |
| PEC_12 | WL_L |
| PEC_13 | WL_M |
| PEC_14 | WL_N |
| PEC_15 | WL_O |

430~

| PEC Thresh | Failed WL |
|------------|-----------|
| PEC_1 | WL_A, WL_B, WL_C, WL_D, WL_E, WL_F, WL_G, WL_H, WL_I, WL_J, WL_K, WL_L, WL_M, WL_N, WL_O |

432~

| PEC Thresh | Failed WL |
|------------|-----------|
| PEC_1 | WL_A, WL_B, WL_C, WL_D, WL_E |
| PEC_6 | WL_F, WL_G, WL_H, WL_I, WL_J |
| PEC_11 | WL_K, WL_L, WL_M, WL_N, WL_O |

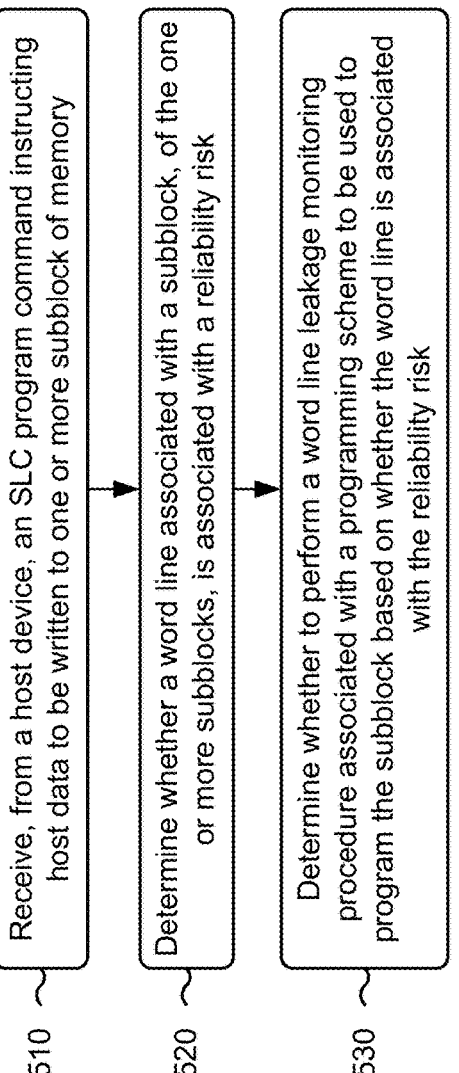

500

510 ⟩ Receive, from a host device, an SLC program command instructing host data to be written to one or more subblock of memory 520 ⟩ Determine whether a word line associated with a subblock, of the one or more subblocks, is associated with a reliability risk 530 ⟩ Determine whether to perform a word line leakage monitoring procedure associated with a programming scheme to be used to program the subblock based on whether the word line is associated with the reliability risk

FIG. 5

SELECTIVE USE OF A WORD LINE MONITORING PROCEDURE FOR RELIABILITY-RISK WORD LINES

CROSS REFERENCE TO RELATED APPLICATION

This patent application claims priority to U.S. Provisional Patent Application No. 63/512,380, filed on Jul. 7, 2023, and entitled "SELECTIVE USE OF A WORD LINE MONITORING PROCEDURE FOR RELIABILITY-RISK WORD LINES." The disclosure of the prior application is considered part of and is incorporated by reference into this patent application.

TECHNICAL FIELD

The present disclosure generally relates to memory devices, memory device operations, and, for example, to selective use of a word line monitoring procedure for reliability-risk word lines.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). In some examples, a non-volatile memory cell, such as a NAND cell, may be categorized as a single-level cell (SLC), a multi-level cell (MLC), a triple-level cell (TLC), or a quad-level cell (QLC), among other examples. An SLC stores a single binary bit per memory cell, and thus may store either a binary 1 or a binary 0. An MLC, a TLC, and a QLC may store multiple bits per memory cell. More particularly, an MLC may store two binary bits per memory cell, a TLC may store three binary bits per memory cell, and a QLC may store four binary bits per memory cell. In some other examples, any cell capable of storing more than one binary bit per cell may be generally referred to as an MLC. To store information, an electronic device may write to, or program, a set of memory cells to a threshold voltage corresponding a binary value (e.g., one of 0 or 1 for an SLC: one of 00, 01, 10, or 11 for an MLC; and so forth). To access the stored information, the electronic device may read, or sense, the stored voltage from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

BRIEF DESCRIPTION OF THE DRAWINGS

FIGS. 4A-4C are diagrams of an example associated with selective use of a word line monitoring procedure for reliability-risk word lines.

FIG. 5 is a flowchart of an example method associated with selective use of a word line monitoring procedure for reliability-risk word lines.

DETAILED DESCRIPTION

Figure 1:
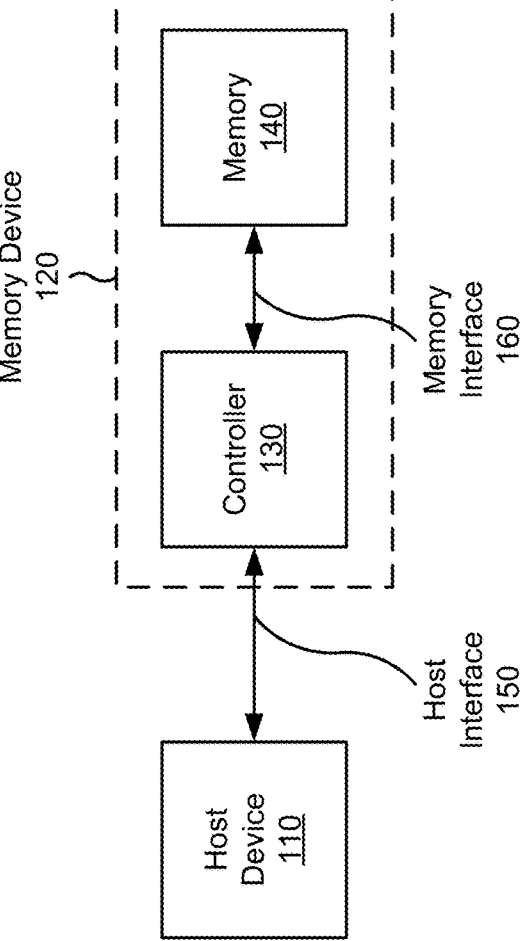
FIG. 1 is a diagram illustrating an example system capable of selective use of a word line monitoring procedure for reliability-risk word lines.

Data may be programmed to a memory cell using a programming scheme (sometimes referred to as a programming operation, a write scheme, and/or a write operation). In some examples, a programming scheme may be associated with one or more programming pulses (sometimes referred to as one or more programming voltages) and one or more verify operations (sometimes referred to as one or more verify pulses and/or voltages). During the one or more programming pulses, data may be written, or programmed, to one or more memory cells. For example, each programming pulse may be associated with programming a subblock of a memory die (e.g., a NAND die). During the one or more verify operations, data previously written to one or more memory cells via the one or more programming pulses may be verified to ensure that the data was properly written to the memory cell.

In some examples, a time needed to program each subblock of data may have a direct impact on a memory system performance. For example, a memory system may use single-level cell (SLC) memory caching for host data that is to be later transferred to a multi-bit cell memory during a background operation, such as a triple-level cell (TLC) memory or a quad-level cell (QLC) memory. Accordingly, a time associated with programming SLC memory may directly impact overall system performance. For example, an SLC programming scheme associated with a relatively high programming time may result in high power consumption and slow operation of the memory system, resulting in degraded system performance.

In some examples, in order to reduce a programming time associated with an SLC programming scheme, one or more programming pulses and/or verify pulses may be combined and/or eliminated, thereby reducing power consumption and/or increasing operation speed. For example, a verify pulse may be eliminated altogether, multiple programming pulses used to program multiple subblocks may be associated with a single verify pulse, and/or a single programming pulse may be used to program multiple subblocks in an effort to reduce a programming time associated with a programming scheme and otherwise improve system performance. However, eliminating a verify operation from a programming scheme may reduce system reliability, because the memory device does not include any mechanism to verify that host data was properly programmed to the SLC memory. Accordingly, when one or more verify operations are eliminated, a memory device may use a word line leakage monitoring procedure or a similar procedure in an effort to ensure reliability of host data. The word line leakage monitoring procedure may monitor for shorts or similar defects in a memory, which may be indicative of program errors for a given subblock and/or word line. However, implementing such word line leakage monitoring procedures may be resource intensive and/or may otherwise reduce an overall performance benefit achieved by eliminating the one or more verify operations, leading to high power, computing, and other resource consumption, increased programming times, and/or reduced memory system performance.

Some implementations described herein enable selective operation of a word line leakage monitoring procedure for reliability-risk word lines, thereby ensuring reliability of the memory system while reducing resource consumption associated with programming schemes for non-reliability-risk word lines. In some implementations, a memory device may receive an SLC program command (sometimes referred to herein as a write command) instructing the memory device to write host data to one or more subblocks of memory. When programming a subblock associated with the SLC program command, the memory device may determine whether a word line associated with the subblock is a reliability-risk word line. If the word line is a reliability risk, the memory device may perform the word line leakage procedure in order ensure reliability of any data programmed to the subblock. However, if the subblock is not a reliability risk, the memory device may omit the word line leakage monitoring procedure, thereby reducing power, computing, and other resource consumption, reducing a programming time of a write operation associated with the subblock, and otherwise improving memory system performance.

FIG. 1 is a diagram illustrating an example system 100 capable of selective use of a word line monitoring procedure for reliability-risk word lines. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device or apparatus configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include control logic, a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, one or more systems, devices, apparatuses, components, and/or controllers of FIG. 1 may be configured to receive, from a host device, an SLC program command instructing the memory device to write host data to one or more subblocks of memory; determine whether a word line associated with a subblock, of the one or more subblocks, is associated with a reliability risk; and determine whether to perform a word line leakage monitoring procedure associated with a programming scheme to be used to program the subblock based on whether the word line is associated with the reliability risk.

In some implementations, one or more systems, devices, apparatuses, components, and/or controllers of FIG. 1 may be configured to receive, from a host device, an SLC program command instructing host data to be written to one or more subblocks of memory: determine whether a word line associated with a subblock, of the one or more sub-blocks, is associated with a reliability risk; and determine whether to perform a word line leakage monitoring procedure associated with a programming scheme to be used to program the subblock based on whether the word line is associated with the reliability risk.

In some implementations, one or more systems, devices, apparatuses, components, and/or controllers of FIG. 1 may be configured to a memory: a controller operatively coupled to the memory and configured to: receive, from a host device, an SLC program command instructing the memory device to write host data to one or more subblocks of the memory: determine whether a word line associated with a subblock, of the one or more subblocks, is associated with a reliability risk: determine whether a program-erase cycle (PEC) count associated with the word line satisfies a PEC threshold; and determine whether to perform a word line leakage monitoring procedure associated with a programming scheme to be used to program the subblock based on whether the word line is associated with the reliability risk and whether the PEC count satisfies the PEC threshold.

As indicated above, FIG. 1 is provided as an example. Other examples may differ from what is described with regard to FIG. 1.

Figure 2:
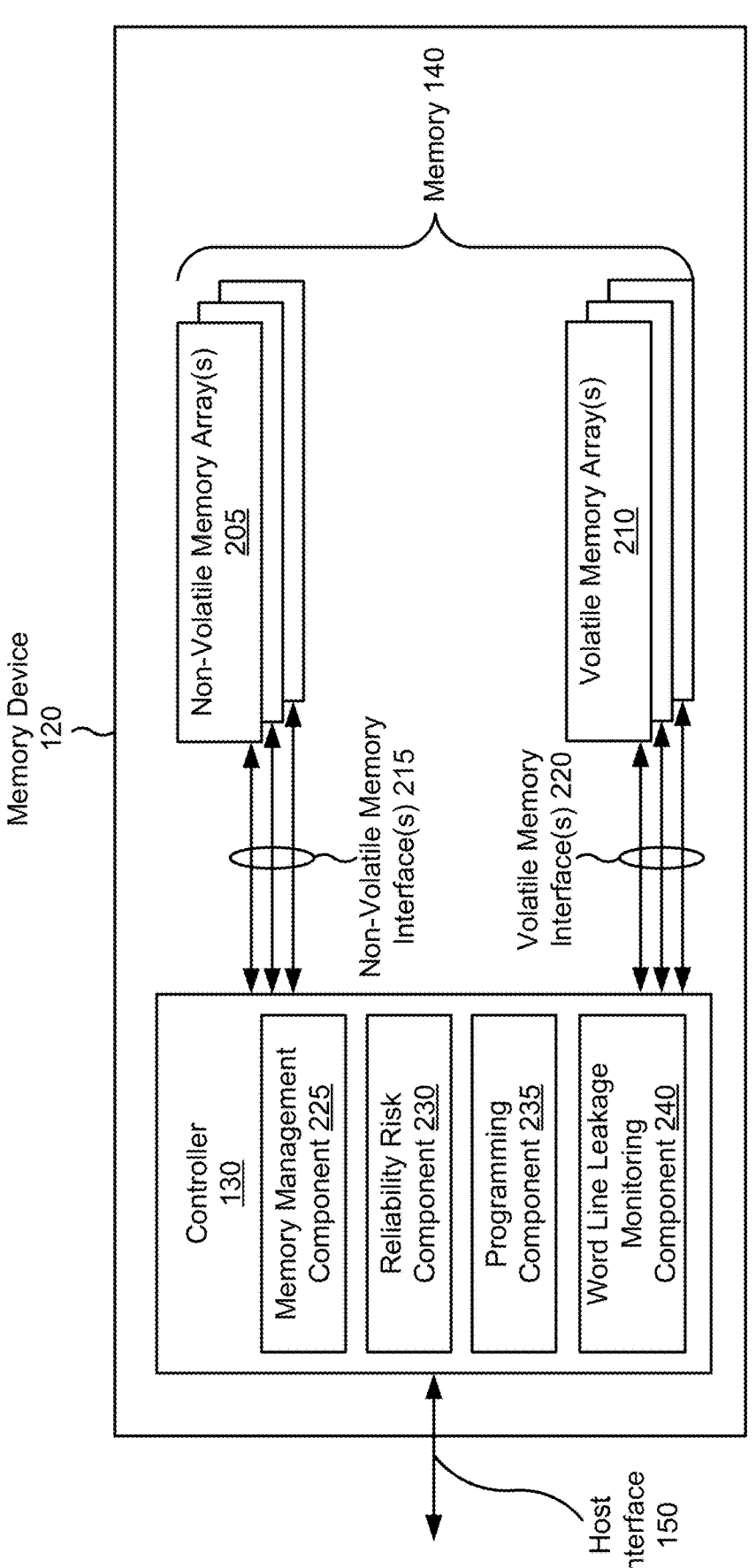
FIG. 2 is a diagram of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 205, such as one or more NAND memory arrays and/or one or more NOR memory arrays. Additionally, or alternatively, the memory 140 may include one or more volatile memory arrays 210, such as one or more SRAM arrays and/or one or more DRAM arrays. The controller 130 may transmit signals to and receive signals from a non-volatile memory array 205 using a non-volatile memory interface 215. The controller 130 may transmit signals to and receive signals from a volatile memory array 210 using a volatile memory interface 220.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 225, a reliability risk component 230, a programming component 235, and/or a word line leakage monitoring component 240. In some implementations, one or more of these components are implemented as one or more instructions (e.g., firmware) executed by the controller 130. Alternatively, one or more of these components may be implemented as dedicated integrated circuits distinct from the controller 130.

The memory management component 225 may be configured to manage performance of the memory device 120. For example, the memory management component 225 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 225, such as information regarding memory block age, memory block erase count, and/or error information associated with a memory partition (e.g., a memory cell, a row of memory, a block of memory, or the like).

The reliability risk component 230 may be configured to identify whether a word line of a memory (e.g., memory 140) is a reliability-risk word line. In some implementations, the reliability risk component 230 may be configured to identify whether a word line is a reliability-risk word line based on defects per million (DPM) statistics or similar data. Additionally, or alternatively, the reliability risk component 230 may be associated with a lookup table, such as one of the lookup tables described below in connection with FIG. 4B. For example, the reliability risk component 230 may be associated with a lookup table that associates certain reliability-risk word lines with corresponding PEC counts, above which the corresponding word line becomes at risk for including write errors following a write procedure.

The programming component 235 may be configured to program, or write, host data to the memory 140. In some implementations, the programming component 235 may be configured to selectively implement one of multiple candidate programming schemes in order to program or write host data to the memory 140. The programming component 235 may be capable of applying a voltage to a memory cell, such as for a purpose of storing a threshold voltage corresponding to a binary value in the memory cell. For example, for SLC program commands, the programming component 235 may be capable of programming each SLC to one of a first threshold voltage representing a binary 0 or a second threshold voltage representing a binary 1.

The word line leakage monitoring component 240 may be configured to perform a word line leakage monitoring procedure. For example, the word line leakage monitoring component 240 may be configured to perform one or more of a charge pump clock monitor (CPCM) procedure or word line short sensor (WLSS) procedure, described in more detail below in connection with FIG. 3B. Additionally, or alternatively, the word line leakage monitoring component 240 may be configured to detect whether a sufficient voltage has been applied to a word line and/or whether a short is associated with a word line, thereby identifying whether a word line has been successfully programmed. In some implementations, the word line leakage monitoring component 240 may be configured to identify failing pages within a memory such that data programmed to the failing pages may be rewritten and/or such that problematic pages may be avoided during subsequent programming operations.

One or more devices or components shown in FIG. 2 may be configured to perform operations described herein, such as one or more operations and/or methods described in connection with FIGS. 3A-6. For example, the controller 130, the memory management component 225, the reliability risk component 230, the programming component 235, and/or the word line leakage monitoring component 240 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3A:
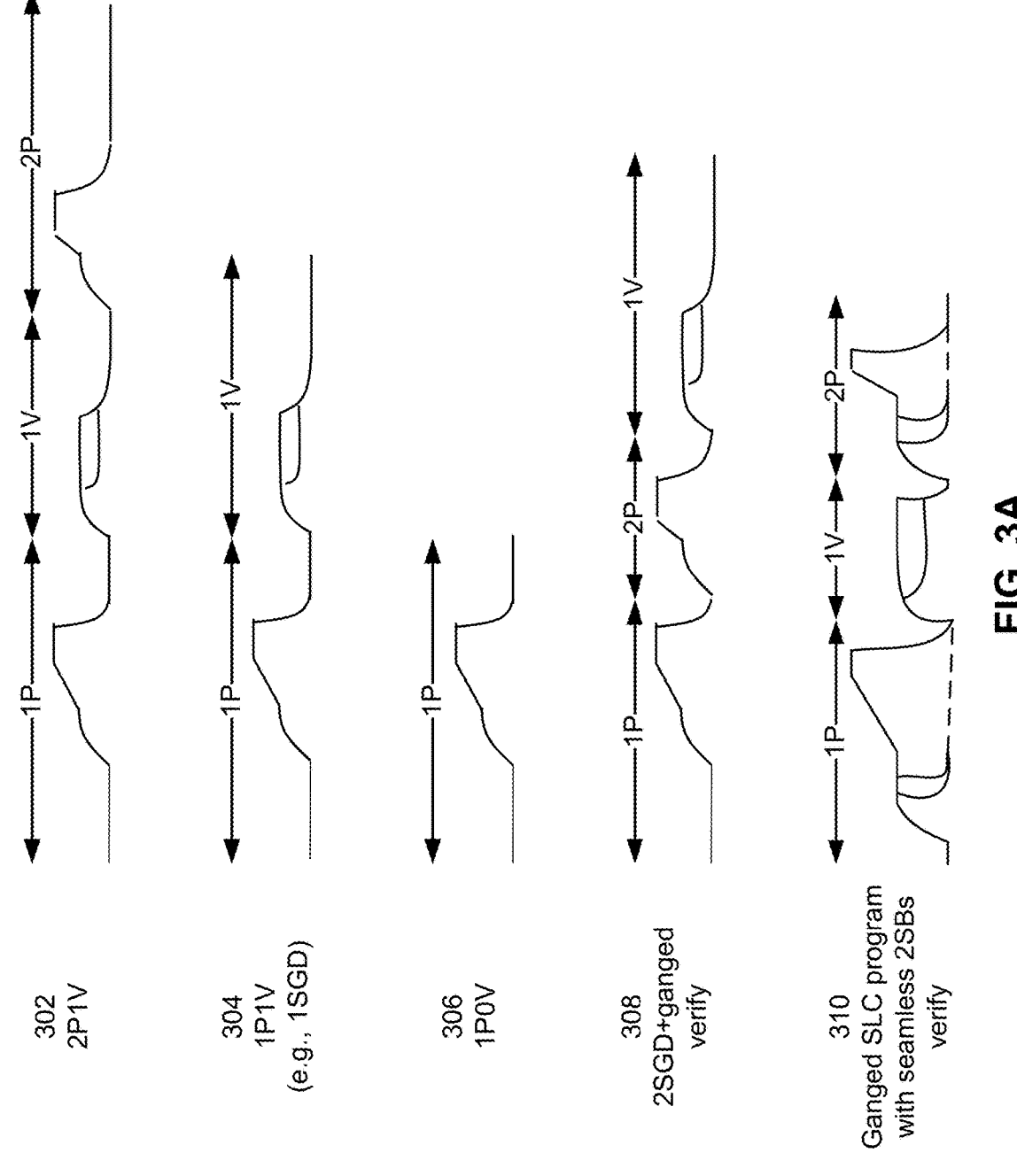
FIGS. 3A-3C are diagrams of an example of various SLC programming schemes and word line leakage monitoring procedures associated therewith.
Figure 3B:
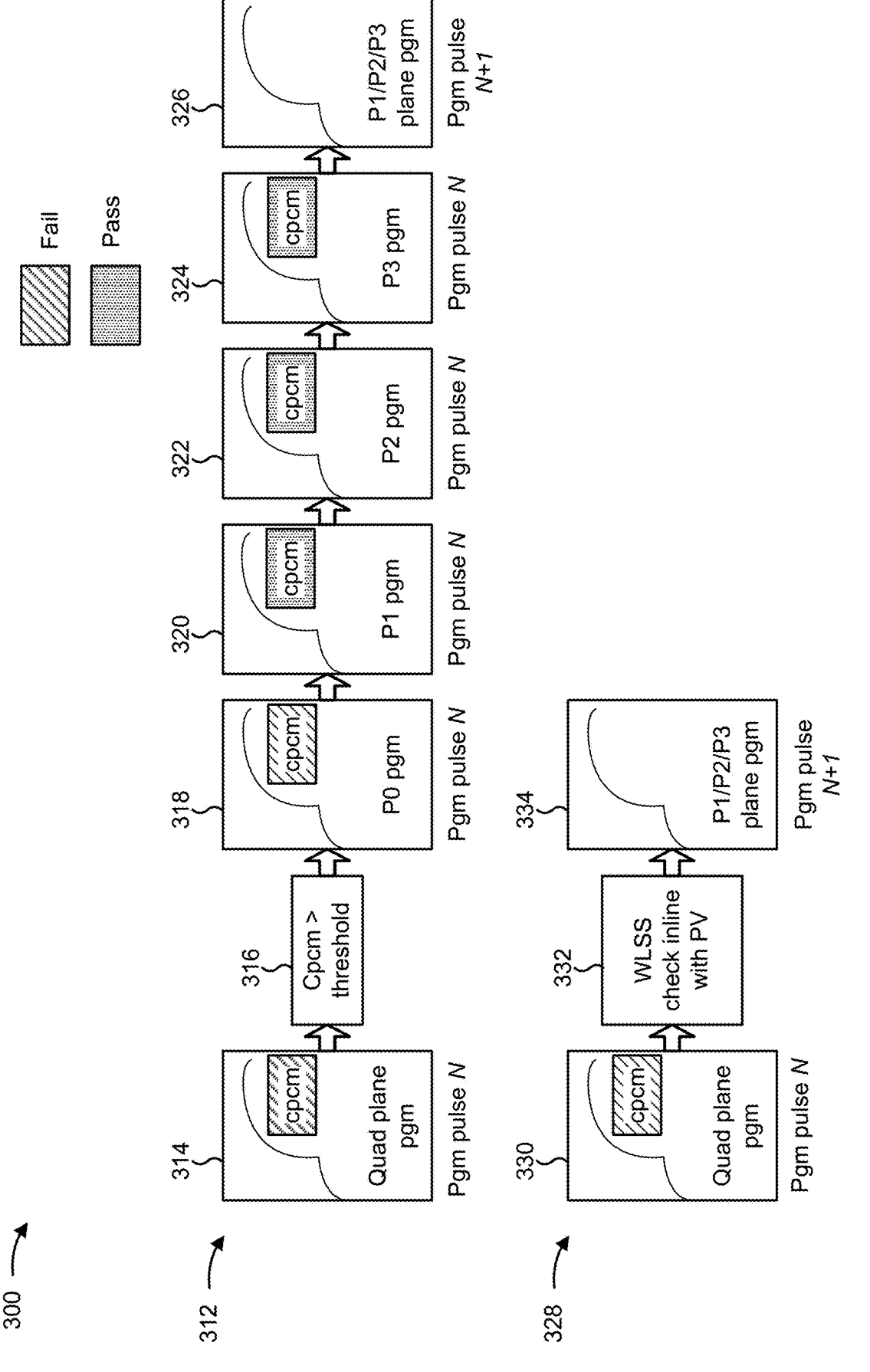
Figure 3C:
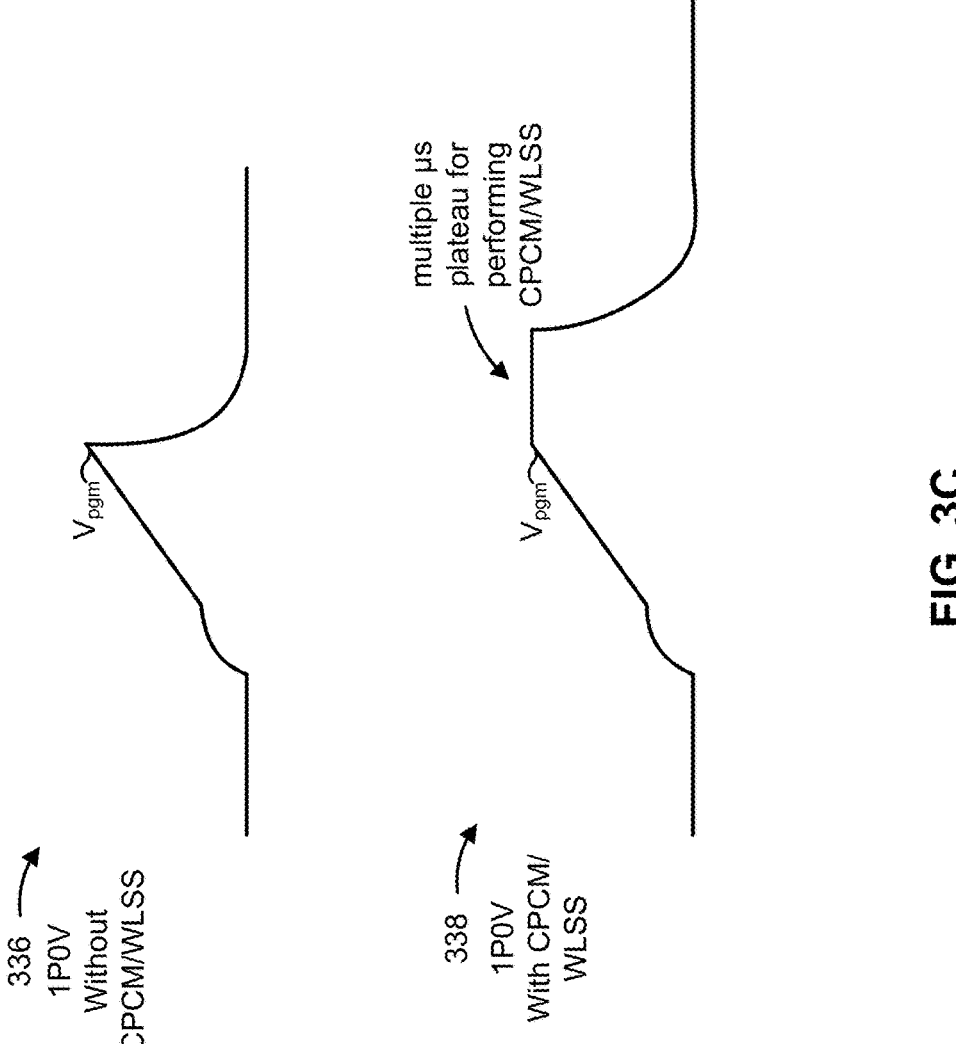

FIGS. 3A-3C are diagrams of an example 300 of various SLC programming schemes and word line leakage monitoring procedures associated therewith. The operations described in connection with FIGS. 3A-3C may be performed by the memory device 120 and/or one or more components of the memory device 120, such as the controller 130 and/or one or more components of the controller 130.

In some implementations, the memory device 120 may be configured to selectively implement one of multiple candidate programming schemes and/or operations. For example, in some implementations, the memory device 120 may be configured to use one of the programming schemes shown in FIG. 3A to program an SLC memory, such as for a purpose of caching host data in the SLC memory that may later be transferred to a TLC memory, a QLC memory, or another memory location during a background operation of the memory device 120.

As shown by reference number 302, in some implementations the memory device 120 may be configured to write host data to an SLC memory using two program pulses and one program verify operation, which may be referred to as a two-pulse, one-verify (2P1V) programming scheme. As shown, the example 2P1V programming scheme may include a first program pulse (shown as "1P") that is followed by a program verify operation (shown as "1V") that is followed by a second program pulse (shown as "2P"). In some implementations, the 2P1V write voltage pattern may be applied to a single subblock of memory to program the memory cells included in that subblock.

In some implementations, when a memory device 120 performs a 2P1V programming scheme, the memory device 120 may raise the voltage on a selected access line from a baseline voltage to a first program voltage during a first time period that corresponds to the first program pulse (e.g., 1P). The first program voltage may program a first set of memory cells (sometimes called pass memory cells) on the selected access line to a desired state and may fail to program a second set of memory cells (sometimes called fail memory cells) on the selected access line to the desired state.

After applying the first program voltage, the memory device 120 may reduce the voltage on the selected access line to the baseline voltage. The memory device 120 may then raise the voltage on the selected access line from the baseline voltage to a verify voltage during a second time period that corresponds to the program verify operation (e.g., 1V). After raising the voltage to the verify voltage, the memory device 120 may perform a sensing operation (e.g., a read operation) to detect whether the verify voltage applied to a memory cell causes that memory cell to conduct (e.g., whether current flows through the memory cell when the verify voltage is applied). Based on a desired state of the memory cell and based on whether the memory cell conducts when the verify voltage is applied, the memory device 120 may identify the memory cell as a pass memory cell that stores the desired state or a fail memory cell that does not store the desired state. For example, in an SLC that stores one of two data states, the memory device 120 may apply a verify voltage that is between a first threshold voltage corresponding to a first data state (e.g., 1) and a second threshold voltage corresponding to a second data state (e.g., 0). In this example, the memory cell stores the first data state (e.g., 1) if current is detected, and the memory cell stores the second data state (e.g., 0) if current is not detected. After applying the verify voltage, the memory device 120 may reduce the voltage on the selected access line to the baseline voltage.

The memory device 120 may then raise the voltage on the selected access line from the baseline voltage to a second program voltage during a third time period that corresponds to the second program pulse (e.g., 2P). The second program voltage may be greater in magnitude than the first program voltage, which may cause some or all of the fail memory cells (e.g., that were not successfully programmed to the desired state based on application of the first program voltage) to be programmed to the desired state. After applying the second program voltage, the memory device 120 may reduce the voltage on the selected access line to the baseline voltage to complete the 2P1V programming.

In some implementations, memory cells that were successfully programmed by the first program voltage, as determined during the program verify operation, may be inhibited from being programmed with the second program voltage. This may increase endurance and prolong a lifespan of those memory cells, as compared to a scenario where the second program voltage is applied to those memory cells, by preventing the second program voltage from causing degradation of those memory cells. Thus, in some implementations, the 2P1V programming scheme may be considered a high endurance write operation compared to the other programming schemes described below. However, in some implementations, the 2P1V programming scheme may be considered a slow write operation as compared to the write voltage patterns described below. That is, an effective programming time associated with the 2P1V programming scheme (e.g., a time associated with programming a sub-block of data) may be relatively high.

Accordingly, as shown by reference number 304, in some implementations the controller 130 may be configured to write host data to an SLC memory using one program pulse and one program verify operation, and thus may be called a one-pulse, one-verify (1P1V) programming scheme (sometimes alternatively referred to as a one select gate drain (1SGD) programming scheme). In such implementations, when a memory device 120 performs a 1P1V programming scheme, the memory device 120 may raise the voltage on a selected access line from a baseline voltage to a program voltage during a first time period that corresponds to a program pulse (e.g., 1P), in a similar manner as described above in connection the 2P1V programming scheme shown in connection with reference number 302. The memory device 120 may then perform a program verify operation (e.g., 1V) by applying a verify voltage during a second time period, in a similar manner as described above in connection with the 2P1V programming scheme shown in connection with reference number 302. Unlike the 2P1V programming scheme, the memory device 120 does not apply a second program pulse after performing the program verify operation in the 1P1V write operation. In some implementations, the program verify operation may be performed to determine whether at least a threshold quantity of memory cells have been successfully programmed. A write operation may pass or fail based on whether at least the threshold quantity of memory cells has been successfully programmed.

In some implementations, the program voltage of the 1P1V write operation is greater than the first program voltage of the 2P1V write operation described above in connection with reference number 302. For example, the program voltage of the 1P1V write operation may be greater than or equal to the second program voltage of the 2P1V write operation described above in connection with reference number 302. As a result, a greater quantity of memory cells may be programmed by the single program pulse of the 1P1V programming scheme as compared to the first program pulse of the 2P1V programming scheme. Because the 1P1V programming scheme includes fewer program pulses than the 2P1V programming scheme, the 1P1V programming scheme may be associated a faster write time than the 2P1V programming scheme (e.g., an effective programming time may be reduced as compared to the 2P1V programming scheme).

As shown by reference number 306, in some implementations the memory device 120 may be configured to write host data to an SLC memory using one program pulse and no verify program operations, and thus may be called a one-pulse, zero-verify (1P0V) programming scheme. In such implementations, when a memory device 120 performs a 1P0V programming scheme, the memory device 120 may raise the voltage on a selected access line from a baseline voltage to a program voltage during a first time period that corresponds to a program pulse (e.g., 1P), in a similar manner as described above in connection with reference numbers 302 and 304. Unlike the 2P1V write operation and the 1P1V write operation, however, the memory device 120 may not perform a program verify operation after applying the single program pulse in the 1P0V write operation.

In some implementations, the program voltage of the 1P0V write operation may be greater than the first program voltage of the 2P1V write operation described above in connection with reference number 302. For example, the program voltage of the 1P0V write operation may be greater than or equal to the second program voltage of the 2P1V write operation described above in connection with reference number 302. Additionally, or alternatively, the program voltage of the 1P0V write operation may be greater than or equal to the program voltage of the 1P1V write operation (because the memory device 120 does not verify that memory cells have been successfully programmed in the 1P0V write operation, and therefore may apply a greater voltage to increase the likelihood of successful programming).

As a result, a greater quantity of memory cells may be programmed by the single program pulse of the 1P0V write operation as compared to the first program pulse of the 2P1V write operation (and, in some implementations, as compared to the single program pulse of the 1P1V write operation). Because the 1P0V write operation includes fewer program pulses and fewer program verify operations than the 2P1V write operation, the 1P0V programming scheme may have a faster write time than the 2P1V programming scheme. Furthermore, because the 1P0V programming scheme includes fewer program verify operations than the 1P1V programming scheme, the 1P0V programming scheme may have a faster write time than the 1P1V programming scheme.

In some implementations, a verify operation may be associated with multiple subblocks (e.g., multiple programming pulses, each associated with a different subblock), thereby further reducing an effective programming time associated with each subblock. Such programming schemes may be referred to as "ganged" programming schemes and/or a verify operation associated with such a programming scheme may be referred to as a "ganged verify." operation. For example, reference number 308 shows one example of a ganged verify operation, sometimes referred to as a two select gate drain (2SGD) plus ganged verify programming scheme. In 2SGD plus ganged verify programming schemes, the memory device 120 may be configured to write host data to a first subblock of an SLC memory using one program pulse (e.g., 1P) and to write host data to a second subblock of SLC memory using another program pulse (e.g., 2P), with one program verify operation (e.g., 1V) ganged to the first program pulse and the second program pulse.

Put another way, for the 2SGD plus ganged verify programming scheme, the memory device 120 may apply a program pulse to each of two different subblocks of memory, and may then perform a group verify operation for both subblocks. For example, the memory device 120 may apply two program pulses (e.g., 1P and 2P), each associated with a different subblock of the memory device 120, followed by a program verify operation (e.g., a group program verify operation). A "subblock" is a portion of a memory block. For example, a subblock may include a subset of NAND strings and/or memory cells included in a block, and each subblock may be mutually exclusive from one another. A bit line may be shared by multiple subblocks. For example, a first subblock (e.g., Subblock 0) may include a first group of NAND strings, a second subblock (e.g., Subblock 1) may include a second group of NAND strings, a third subblock (e.g., Subblock 2) may include a third group of NAND strings, and a fourth subblock (e.g., Subblock 3) may include a fourth group of NAND strings. Each NAND string may include a respective memory cell that is on the selected access line to be programmed.

As shown, the memory device 120 may apply a first program pulse (e.g., 1P) to the first sub-block by applying a program voltage on the selected access line for the first subblock (e.g., while the first subblock is selected and the other subblocks are not selected) during a first time period, in a similar manner as described elsewhere herein. After applying the first program pulse, the memory device 120 may apply a second program pulse (e.g., 2P) to the second subblock by applying the program voltage on the selected access line for the second subblock (e.g., while the second subblock is selected and the other subblocks are not selected) during a second time period, in a similar manner as described elsewhere herein.

After applying a separate program pulse to each subblock, the memory device 120 may perform a group program verify operation (e.g., 1V) on all of the subblocks (e.g., simultaneously, concurrently, or in parallel). The group program verify operation may include applying a verify voltage during a third time period. The memory device 120 may apply the verify voltage to all of the subblocks, such as by selecting all of the subblocks while applying the verify voltage to the access line. After raising the voltage to the verify voltage, the memory device 120 may perform a sensing operation (e.g., a read operation) to detect memory cells that are programmed to the desired state and to detect memory cells that are not programmed to the desired state.

Because the 2SGD plus ganged verify programming scheme includes fewer total verify operations than the 2P1V programming scheme and/or the 1P1V programming scheme, the 2SGD plus ganged verify programming scheme may have a faster write time per subblock than the 2P1V programming scheme and/or the 1P1V programming scheme (e.g., an effective programming time associated with the 2SGD plus ganged verify programming scheme, which may be an average programming time per subblock programmed, may be less than the effective programming time of the 2P1V programming scheme and/or the 1P1V programming scheme).

Reference number 310 shows another example of a ganged verify operation, sometimes referred to as a ganged SLC program with ganged verify and/or seamless two subblocks verify programming scheme. In a ganged SLC program, the memory device 120 may be capable of programming two or more sub-blocks with a single program pulse. In the example shown by reference number 310, the memory device 120 may apply a first program pulse (e.g., 1P) configured to write to two subblocks of the memory device 120 (e.g., Subblock 0 and Subblock 1), followed by a group program verify operation (e.g., 1V) on the two subblocks, followed by a second program pulse (e.g., 2P) configured to write to the two subblocks of the memory device. In some implementations, such as implementations utilizing a seamless two subblocks verify operation, the memory device 120 may sense a voltage written to each subblock twice, with each select gate drain (SGD) and bitline signal being toggled separately. In some other implementations, a ganged SLC program may alternatively be combined with a ganged verify operation, such as the ganged verify operation described above in connection with reference number 308.

For example, the memory device 120 may apply the first program pulse (e.g., 1P) to the first subblock and the second subblock by applying a first program voltage on the selected access line for the first subblock and the second subblock during a first time period. After applying the first program pulse, the memory device 120 may perform a group program verify operation (e.g., 1V) on the first subblock and the second subblock (e.g., simultaneously, concurrently, or in parallel). The group program verify operation may include applying a verify voltage during a second time period, in a similar manner as described above in connection with the 2SGD plus ganged verify programming scheme and/or in a manner associated with the seamless two subblocks verify operation described above. The memory device 120 may identify pass memory cells and fail memory cells in the first subblock and the second subblock, and may apply the second program pulse (e.g., 2P) to the first subblock and the second subblock by applying a second program voltage on the selected access line for fail memory cells of the first subblock and the second subblock during a third time period. Because the ganged SLC program with ganged verify and/or seamless two subblocks verify programming scheme is capable of writing to multiple subblocks using the same program pulse, the ganged SLC program with ganged verify and/or seamless two subblocks verify programming scheme may have a faster write time on a per-subblock basis than the 1P1V programming scheme and/or the 2SGD plus ganged verify programming scheme.

In some examples, such as examples implementing programming schemes associated with no verify operations (such as the 1P0V programming scheme described above in connection with reference number 306), a memory device 120 may perform another operation in order to determine if data was properly written to a memory during the program pulse (e.g., 1P). For example. FIG. 3B shows example word line leakage monitoring procedures (sometimes referred to as word link leakage detection schemes) that may be used to determine if data was properly written to memory during one of the programming schemes described above in connection with FIG. 3A. More particularly, in some examples, improperly written data during the program pulse stage of a programming scheme may arise from a short in a memory 140 that prevents a charge pump from supplying a sufficient program voltage necessary to achieve a good program. Accordingly, in some examples, a memory device 120 may monitor the charge pump to determine if the charge pump is working harder than normal and/or is working harder than is typical to program a voltage to a memory 140 during a write operation. If the charge pump is working harder than normal, the memory device 120 may determine that there is a problem with a portion of the memory 140 (e.g., that there is a short in the memory 140), which in turn may be indicative that any data programmed thereto may contain write errors.

In some examples, a memory device 120 may monitor operation of a charge pump via a CPCM procedure. In such examples, a charge pump may include an internal feedback system that includes an internal clock that may be toggled as needed in order to maintain and/or drive a required voltage at an output of the charge pump. By monitoring an internal clock count via a CPCM procedure, the memory device 120 may infer how hard a charge pump is working. When a CPCM counter result falls below a threshold and/or remains in a typical operating range, the memory device 120 may determine that the charge pump is behaving normally and thus there is no short in the memory 140 and/or there is little risk of programming errors associated with a given subblock and/or word line. On the other hand, when the CPCM counter result satisfies a threshold and/or is above a typical operating range, the memory device 120 may determine that the charge pump is working harder than normal to maintain and/or drive a required voltage at an output of the charge pump, which may be indicative of a short in the memory 140 and/or a high risk of programming errors associated with a given subblock and/or word line.

FIG. 3B shows two different examples of word line leakage detection schemes associated with a CPCM procedure. In some examples, one or both of the word line leakage detection schemes shown in FIG. 3B may be associated with a quad plane programming operation (e.g., a programming operation associated with a plane including four pages) and/or may be referred to as a QuadX detection scheme. First, in the example shown by reference number 312, and as indicated by reference number 314, the memory device 120 may monitor a quad plane CPCM (e.g., a CPCM associated with a program operation associated with four pages, indexed in FIG. 3B as P0 through P3) for a given program pulse, shown in the example as program ("pgm") pulse N. More particularly, the memory device may perform a CPCM count during a highest voltage of the program pulse N, sometimes referred to as $V_{pgm}$. If the quad plane CPCM indicates an issue (e.g., if the quad plane CPCM count satisfies a threshold during $V_{pgm}$, as indicated by reference number 316), the memory device 120 may perform a WLSS check. The WLSS check may drive the word lines associated with the four pages in a manner that creates a detectable current (e.g., a detectible word-line-to-word-line current and/or a detectible word-line-to-pillar current). The detectible currents may be fed to the controller 130, which may mark any failing pages as bad while resuming a program operation on any remaining good pages (e.g., any pages associated with abnormally high currents may be marked as failed). For example, in the example shown in connection with reference number 312, as indicated by reference number 318, the WLSS check may indicate that a P0 program failed (indicated by reference number 318) and that a P1 program, a P2 program, and a P3 program passed (indicated by reference numbers 320, 322, and 324, respectively). Accordingly, as shown by reference number 326, for the next program pulse (shown in FIG. 3B as program pulse N+1), the memory device 120 may write data to pages P1, P2, and P3, but may skip P0 (e.g., may not write data to page P0) because that page did not pass the CPCM/WLSS check.

Alternatively, as shown by reference number 328, in some examples, a WLSS check may be performed in-line with a program verify (shown in FIG. 3B as "PV"). In such examples, as indicated by reference number 330, the memory device 120 may monitor a quad plane CPCM for a given program pulse, such as by performing a CPCM count during a highest voltage of the program pulse N (e.g., $V_{pgm}$). If the quad plane CPCM indicates an issue (e.g., if the quad plane CPCM count satisfies a threshold during $V_{pgm}$), the memory device 120 may perform a WLSS check. In this example, as indicated by reference number 332, the WLSS check may be performed in-line with the program verify. Put another way, if the memory device 120 detects an anomaly during a CPCM procedure, the memory device 120 may trigger a WLSS procedure in a program verify. For example, the WLSS check indicated by reference number 332 may indicate that a P0 program failed and that a P1 program, a P2 program, and a P3 program passed. Accordingly, as shown by reference number 334, for the next program pulse (shown in FIG. 3B program as pulse N+1), the memory device 120 may write data to pages P1, P2, and P3, but may skip P0 (e.g., may not write data to page P0) because that page did not pass the CPCM/WLSS check.

In some examples, eliminating a verify operation from a given programming scheme may result in improved system performance, because a programming time and/or power consumption associated with programming each subblock of memory 140 may be reduced. For example, with respect to an SLC program operation, using a 1P0V programming scheme (e.g., the 1P0V programming scheme described above in connection with reference number 306) rather than a 1P1V programming scheme (e.g., the 1P1V programming scheme described above in connection with reference number 304) may result in a programming time reduction of approximately multiple microseconds (µs) per subblock. This may result in memory system performance improvement, an average reduction in a supply current and/or a common collector current (Icc), and/or a reduction in energy per bit (EPB) consumption.

However, in order to implement a word line leakage detection scheme in an SLC programming scheme, such as one of the word line leakage detection schemes described above in connection with FIG. 3B, a highest program voltage (e.g., $V_{pgm}$) may need to be maintained for a period of time sufficient to perform the necessary CPCM/WLSS procedure. For example, as shown in FIG. 3C, and as indicated by reference number 336, during a program pulse of a 1P0V programming scheme that does not implement a word line leakage detection scheme, a memory device 120 may ramp up to a maximum program voltage (e.g., $V_{pgm}$) and may immediately ramp back down again, without maintaining a program voltage and the maximum program voltage for any significant period of time. However, as indicated by reference number 338, during a program pulse of a 1P0V programming scheme implementing a word line leakage detection scheme, a memory device 120 may ramp up to a maximum program voltage (e.g., $V_{pgm}$) and may maintain the voltage at the maximum program voltage for a sufficient period of time in order to perform the word line leakage detection scheme (e.g., perform counts associated with a CPCM/WLSS procedure). For example, the 1P0V programming scheme implementing a word line leakage detection scheme may be associated with a multiple us plateau at the maximum program voltage (e.g., $V_{pgm}$) for performing the word line leakage detection scheme. Implementing the multiple us plateau for performing the word line leakage detection scheme may reduce the system performance benefits associated with omitting a verify operation from the SLC programming scheme. More particularly, implementing the multiple us plateau for performing the word line leakage detection scheme may result in higher effective programming times per subblock and otherwise inefficient memory operations.

According to some implementations described herein, a memory device 120) may perform a word line leakage detection scheme (e.g., a CPCM/WLSS procedure) only for reliability-risk word lines. In some implementations, upon receiving an SLC program command from a host device 110 that instructs the memory device 120 to write host data to a word line of memory, the memory device 120 may determine whether the word line is associated with a reliability risk. For example, due to memory system hardware architecture or otherwise, certain word lines may be more prone to experience a short and/or may otherwise be associated with a higher reliability risk than other word lines. Accordingly, the memory device 120 may determine whether a given word line is associated with a high reliability risk. If so, the memory device 120 may perform a word line leakage monitoring procedure associated with a programming scheme corresponding to the SLC program command, thereby improving reliability of the host data being written to the word line. On the other hand, if the memory device 120 determines that the given word line is not associated with a high reliability risk, the memory device may forgo the word line leakage monitoring procedure, thereby consuming power, computing, and other resources that would have otherwise been consumed performing the word line leakage monitoring procedure and otherwise resulting in more efficient memory device operation. Example implementations associated with selective use of a word line monitoring procedure for reliability-risk word lines are described in more detail below in connection with FIGS. 4A-5.

As indicated above, FIGS. 3A-3C are provided as an example. Other examples may differ from what is described with regard to FIGS. 3A-3C.

Figure 4A:
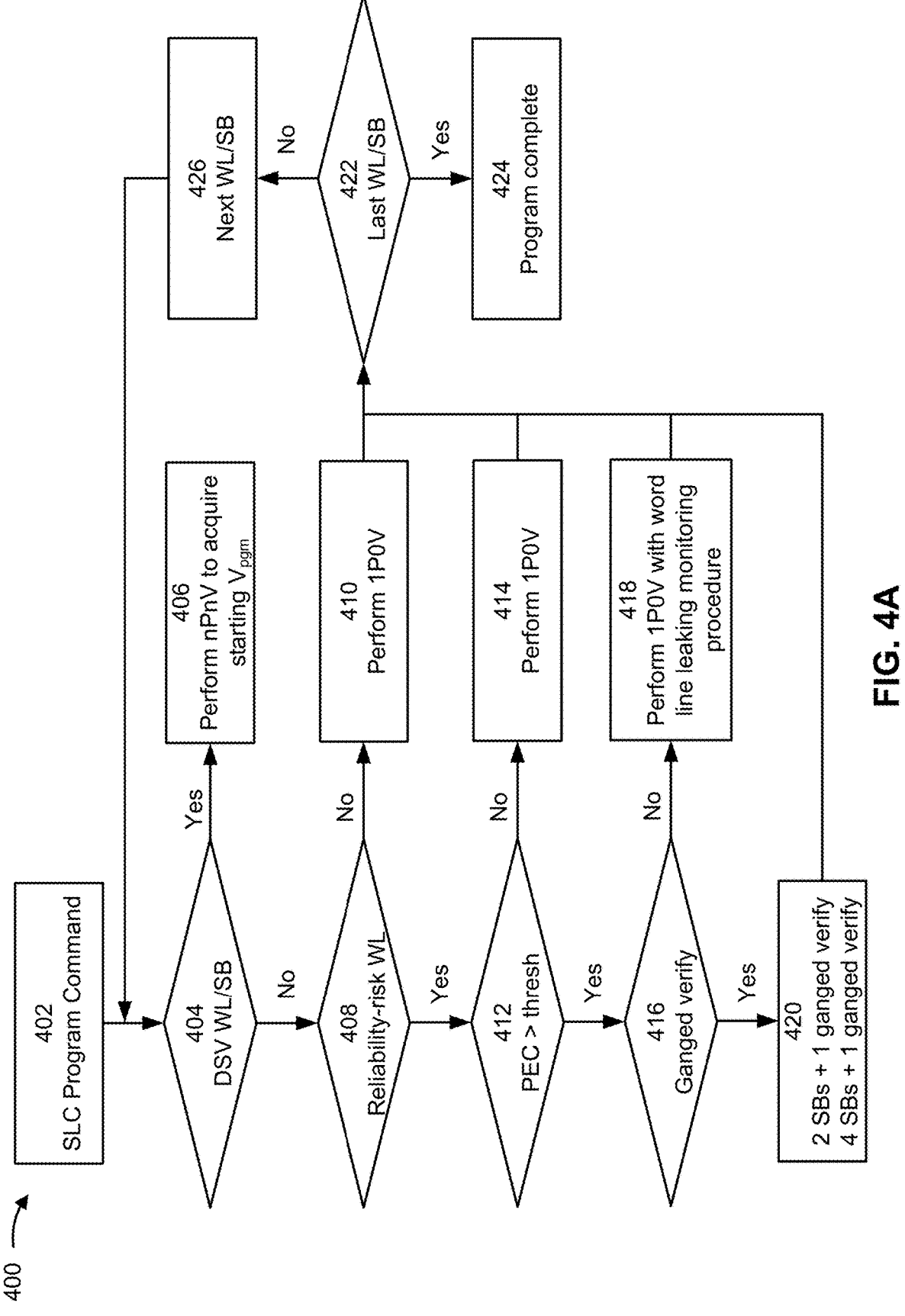
Figure 4C:
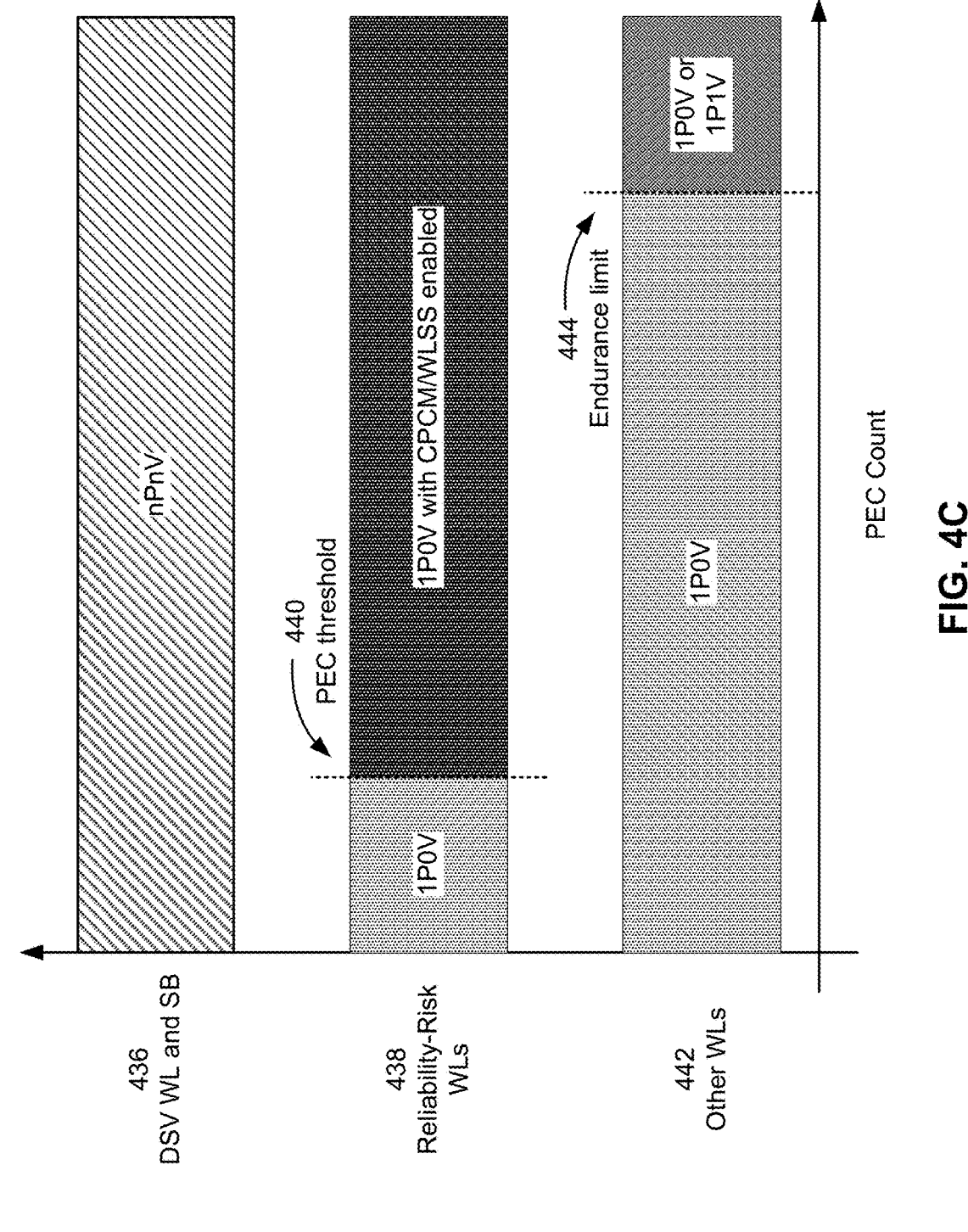

FIGS. 4A-4C are diagrams of an example 400 associated with selective use of a word line monitoring procedure for reliability-risk word lines. The operations described in connection with FIGS. 4A-4C may be performed by the memory device 120 and/or one or more components of the memory device 120, such as the controller 130 and/or one or more components of the controller 130.

As shown in FIG. 4A, and as indicated by reference number 402, in some implementations, a memory device 120 may receive, from a host device 110, an SLC program command instructing the memory device 120 to write host data to one or more subblocks of memory (e.g., memory 140). As shown by reference number 404, the memory device 120 may determine if a subblock to be programmed is associated with a dynamic start voltage (DSV) word line and/or subblock, which may be a word line and/or subblock used to determine a baseline program voltage (e.g., $V_{pgm}$) for subsequent program commands and/or write operations. If the subblock is associated with a DSV, then the memory device 120 may proceed using a default procedure to determine the $V_{pgm}$. For example, as shown by reference number 406, the memory device 120 may program the subblock using a programming scheme associated with n program pulses and/or n verify operations, sometimes referred to as an nPnV programming scheme, in order to acquire the starting $V_{pgm}$.

If the subblock is not associated with a DSV word line and/or subblock, the memory device 120 may determine whether to perform a word line leakage monitoring procedure (e.g., a CPCM count and/or WLSS check) associated with a programming scheme to be used to program the subblock based on a word line associated with the subblock being associated with the reliability risk. If the word line is associated with a reliability risk, the memory device 120 may perform the word line leakage monitoring procedure (e.g., the CPCM/WLSS procedure) in order to ensure the integrity of the host data being written to the memory. However, if the word line is not associated with a reliability risk, the memory device 120 may omit the word line leakage monitoring procedure, which may conserve power, computing, and other resources that may otherwise be associated with performing word link leakage monitoring procedures for these word lines.

More particularly, as indicated by reference number 408, the memory device 120 may determine whether the word line associated with the subblock to be programmed is associated with a reliability risk. In some implementations, the memory device 120 may do so based on DPM information and/or similar statistical information. For example, due to a specific architecture of the memory being written to, certain word lines may be more prone to shorts or other defects, resulting in unreliable word lines and/or word lines susceptible to program errors. Accordingly, for word lines associated with high DPM counts (sometimes referred to as reliability-risk word lines), the memory device 120 may be configured to perform the word line leakage monitoring procedure, such as for a purpose of ensuring that host data is properly written to the reliability-risk word lines.

As indicated by reference number 410, if the word line associated with the subblock is not a reliability-risk word line, the memory device 120 may perform a certain programming scheme (e.g., one of the programming schemes described above in connection with FIG. 3A) without performing a word line leakage monitoring procedure. For example, the memory device 120 may perform a 1P0V programming scheme that does not include a multiple us plateau or similar operation to accommodate for a word line leakage monitoring procedure, as described above in connection with reference number 336 of FIG. 3C. Put another way, in some implementations, the memory device 120 may be configured to, based on determining that the word line is not associated with the reliability risk, perform a programming scheme associated with one programming pulse and zero verify operations (e.g., a 1P0V programming scheme) without performing the word line leakage monitoring procedure. In this regard, the memory device 120 may conserve power, computing, and similar resources when performing the SLC write operation, while reducing a programming time associated with the write operation and/or improving overall system performance.

In some implementations, determining whether to perform the word line leakage monitoring procedure for reliability-risk word lines may be further dependent on a PEC count associated with the word line. More particularly, in some implementations, certain reliability-risk word lines may be prone to shorts or other defects at relatively low PEC counts, while other reliability-risk word lines may be prone to shorts or other defects only at relatively high PEC counts. Accordingly, in some implementations, determining whether to implement a word line leakage monitoring procedure may be PEC-count dependent. In such implementations, as shown by reference number 412, the memory device 120 may determine whether a PEC count associated with the word line satisfies a PEC threshold, and/or the memory device 120 may determine whether to perform the word line leakage monitoring procedure based on whether the PEC count satisfies the PEC threshold.

For example, as indicated by reference number 414, if the host data is to be written to a subblock associated with a reliability-risk word line but a PEC count associated with word line is below a PEC threshold (e.g., a PEC level at which reliability for the corresponding word line may become a concern), the memory device 120 may determine that there is little reliability risk and thus may perform a write operation without implementing a word line leakage monitoring procedure. In some implementations, doing so may include the memory device 120 performing the write operation using a 1P0V programming scheme without performing the word line leakage monitoring procedure, as described above in connection with reference number 336 in FIG. 3C. In that regard, upon determining that the SLC program command is associated with a reliability-risk word line, the memory device may reference a data set (e.g., a lookup table) to determine a PEC threshold associated with the word line. More particularly, the memory device 120 may determine whether to perform the word line leakage monitoring procedure based on a lookup table that associates one or more word lines associated with the reliability risk with one or more PEC thresholds, which is described in more detail below in connection with FIG. 4B.

In some implementations, determining whether to perform the word line leakage monitoring procedure for a reliability-risk word line may further be dependent on whether another verify operation is to be performed for the write operation. For example, in implementations in which the memory device 120 is to perform a ganged verify operation or a similar verify operation in association with the write operation, such as one of the verify operations described above in connection with FIG. 3A, performing the word line leakage monitoring operation may be unnecessary or redundant, and thus the memory device 120 may omit performance of the word line leakage monitoring procedure. However, in implementations in which the memory device 120 is not to perform a verify operation (e.g., a ganged verify operation) for the reliability-risk word line, the memory device 120 may perform the word line leakage monitoring procedure in order to ensure the integrity of the host data being written to memory.

More particularly, as indicated by reference number 416, the memory device 120 may determine whether a ganged verify programming scheme is to be used to program the subblock. As indicated by reference number 418, if a ganged verify programming scheme is not to be used to program the subblock, the memory device 120 may perform a programming scheme associated with the word line leakage monitoring procedure. For example, the memory device 120 may perform a 1P0V programming scheme that implements a word line leakage monitoring procedure (e.g., a CPCM/ WLSS procedure), such as the 1P0V programming scheme described above in connection with reference number 338 of FIG. 3C. Put another way, based on determining that the word line is associated with the reliability risk, that the PEC count satisfies the PEC threshold, and/or that the ganged verify programming scheme is not to program the subblock, the memory device 120 may perform the word line leakage monitoring procedure, such as by performing the word line leakage monitoring procedure in connection with a programming scheme associated with one programming pulse and zero verify operations (e.g., a 1P0V programming scheme).

On the other hand, and as indicated by reference number 420, in implementations in which the memory device 120 is configured to perform the write operation using a verify operation, such as a ganged verify operation, the memory device 120 may perform a programming scheme associated with a ganged verify operation, and thus may omit performing the word line leakage monitoring procedure (e.g., the ganged verify operation may be performed in lieu of the word line leakage monitoring procedure). For example, the memory device 120 may perform a programming scheme associated with programming two subblocks with a ganged verify operation (e.g., the programming schemes described above in connection with reference numbers 308 and 310), a programming scheme associated with programming four subblocks with a ganged verify operation (e.g., a programming scheme similar to the programming schemes described above in connection with reference numbers 308 and 310 but in which four total subblocks are programmed), or a similar programming scheme that includes a verify operation.

The memory device 120 may proceed in a similar manner for each subsequent subblock of the one or more subblocks associated with the SLC program command, thus determining whether each subsequent subblock is associated with a reliability-risk word line and/or performing a word line leakage monitoring procedure (e.g., a CPCM/WLSS check) for subblocks associated with reliability-risk word lines. For example, after performing a write operation for a first subblock for the SLC program command, such as by performing a 1P0V programming scheme without performing a word line leakage monitoring procedure (as described above in connection with reference numbers 410 and 414), by performing a 1P0V programming scheme and a word line leakage monitoring procedure (as described above in connection with reference number 418), or by performing a programming scheme associated with a ganged verify operation (as described above in connection with reference number 420), the memory device 120 may determine whether any more subblocks are to be programmed according to the SLC program command. Put another way, as indicated by reference number 422, the memory device 120 may determine whether a subblock programmed via the operations described above in connection with reference numbers 410, 414, 418, or 420 is a last subblock to be programmed for the SLC program command.

As indicated by reference number 424, if the subblock is the last subblock to be programmed, the memory device 120 may determine that the SLC program command is complete. However, as indicated by reference number 426, if the subblock is not the last subblock to be programmed, the memory device 120 may move to the next subblock associated with the SLC program command, as indicated by reference number 426. In this regard, the memory device may perform one more of the operations shown in connection with reference numbers 404-422 for the next subblock. More particularly, the memory device 120 may determine whether a word line associated with the next subblock is associated with a reliability risk, if so whether a corresponding PEC threshold is satisfied, and/or whether any other verify operations are to be performed for the next subblock, and the memory device 120 may perform a corresponding programming scheme (e.g., one of the programming schemes described above in connection with reference numbers 410, 414, 418, and 420), accordingly.

As described above in connection with reference number 412, in some implementations, the memory device 120 may determine whether to perform the word line leakage monitoring procedure based on a lookup table that associates one or more reliability-risk word lines with one or more PEC thresholds. In that regard, FIG. 4B shows three example lookup tables (e.g., a first lookup table 428, a second lookup table 430, and a third lookup table 432) that may be used by the memory device 120 in order to determine if a word line leakage monitoring procedure should be performed. More particularly, the first lookup table 428 is an example of a lookup table that associates each of various reliability-risk word lines (shown in FIG. 4B as "WL_X." with X being equal to one of A through O) with a corresponding PEC threshold (shown in FIG. 4B as "PEC_Y," with Y being equal to one of 1 through 15). PEC threshold 1 may be a smallest PEC threshold of the PEC thresholds listed in FIG. 4B, and PEC threshold 15 may be a largest PEC threshold of the PEC thresholds listed in FIG. 4B. As described above, the various reliability-risk word lines and/or a corresponding PEC threshold may be determined based on DPM information or similar statistical data.

In this example, word line A may be considered the least reliable word line associated with a memory, and thus word line A may be associated with a smallest PEC threshold (e.g., approximately 50) PECs or the like). Word line O, on the other hand, while still considered a reliability-risk word line, may pose the least risk of the reliability-risk word lines, tending to include a defect only after a high number of PECs (e.g., several thousand PECs, or the like). In this regard, in implementations in which the memory device 120 utilizes the first lookup table 428, the memory device 120 may determine whether a given word line is a reliability-risk word line by determining whether the word line is listed in the first lookup table 428 (e.g., in connection with the operations described above in connection with reference number 408). If the word line is listed in the first lookup table 428, the memory device 120 may determine whether a PEC count associated with the word line satisfies the corresponding PEC threshold provided by the first lookup table 428 (e.g., in connection with the operations described above in connection with reference number 412). For example, when writing host data to word line E, the memory device 120 may determine whether a PEC count associated with the word line satisfies PEC threshold 5; when writing host data to word line J, the memory device 120 may determine whether a PEC count associated with the word line satisfies PEC threshold 10; when writing host data to word line N, the memory device 120 may determine whether a PEC count associated with the word line satisfies PEC threshold 14; and so forth. In that regard, if the word line is a reliability-risk word line (e.g., included in the first lookup table 428), and if a PEC count associated with the word line satisfies a corresponding PEC threshold as indicated by the first lookup table 428, the memory device 120 may perform a word line leakage monitoring procedure (as described above in connection with reference number 418) and/or may perform a ganged verify programming scheme (as described above in connection with reference number 420).

The first lookup table 428 is just one example of a lookup table that may be used by the memory device 120 in connection with one or more of the operations described above in connection with FIG. 4A. In some other implementations, a different type of lookup table may be used without departing from the scope of the disclosure. For example, the first lookup table 428 may be associated with a high system performance gain, because each word line is associated with a corresponding PEC threshold, and thus a word line leakage monitoring procedure may be performed for a given word line only when there is a substantial reliability risk. However, due to the detailed granularity of the first lookup table 428 (e.g., due to including a separate PEC threshold for each reliability-risk word line), the first lookup table may be relatively complicated for the memory device 120 firmware to implement. In that regard, in some implementations, a lookup table that includes less granularity than the first lookup table 428 may be utilized, such as for a purpose of reducing complexity at the memory device 120.

More particularly, the second lookup table 430 is an example of a lookup table that associates all reliability-risk word lines (e.g., word line A through word line O in the example shown in FIG. 4B) with a single PEC threshold (e.g., a lowest PEC threshold among each of the reliability-risk word lines). More particularly, as described above in connection with the first lookup table 428, based on DPM information or otherwise, word line A may be considered the least reliable word line associated with a memory. Accordingly, in this example, each of the reliability-risk word lines (e.g., word line A through word line O) may be associated with a single PEC threshold, which may correspond to the PEC threshold associated with the least reliable word line (e.g., PEC threshold 1 in this case, corresponding to word line A). In this regard, in implementations in which the memory device 120 utilizes the second lookup table 430, the memory device 120 may determine whether a given word line is a reliability-risk word line by determining whether the word line is listed in the second lookup table 430 (e.g., in connection with the operations described above in connection 408). If so, the memory device 120 may determine whether a PEC count associated with the word line satisfies the single PEC threshold of the second lookup table 430 (e.g., PEC threshold 1 in the depicted example) (e.g., in connection with the operations described above in connection with reference number 412). If the word line is a reliability-risk word line (e.g., included in the second lookup table 430), and if a PEC count associated with the word line satisfies the PEC threshold indicated by the second lookup table 430, the memory device 120 may perform a word line leakage monitoring procedure (as described above in connection with reference number 418) and/or may perform a ganged verify programming scheme (as described above in connection with reference number 420).

Due to the coarse granularity of the second lookup table 430, the second lookup table 430 may be relatively easy for the memory device 120 firmware to implement. However, the coarse granularity of the second lookup table 430 (e.g., using a same PEC threshold for each reliability-risk word line) may result in a relatively poor system performance improvement as compared to examples implementing the first lookup table 428, because a word line leakage monitoring procedure may be performed for all reliability-risk word lines once a relatively small PEC threshold is satisfied, which may be unnecessary for word lines that only pose a significant reliability risk at high PEC counts. Accordingly, in some implementations, a lookup table that includes less granularity than the first lookup table 428 but more granularity than the second lookup table 430 may be utilized, such as for a purpose of reducing complexity at the memory device 120 as compared to implementations employing the first lookup table 428, while improving system performance at the memory device 120 as compared to implementations employing the second lookup table 430.

More particularly, the third lookup table 432 is an example of a lookup table that associates groups of reliability-risk word lines (e.g., groups including one or more of word line A through word line O) with a corresponding PEC threshold. More particularly, the third lookup table 432 may include a quantity of PEC thresholds that is less than a quantity of reliability-risk word lines, with each PEC threshold being associated with multiple reliability-risk word lines. For example, in the depicted example, the third lookup table includes three PEC thresholds: PEC threshold 1, PEC threshold 6, and PEC threshold 11. Thus, reliability-risk word lines that pose a significant reliability risk when a corresponding PEC count is at least PEC threshold 1 but less than PEC threshold 6 may be associated in the third lookup table 432 with PEC threshold 1, which, in the depicted example, are word line A, word line B, word line C, word line D, and word line E. Reliability-risk word lines that pose a significant reliability risk when a corresponding PEC count is at least PEC threshold 6 but less than PEC threshold 11 may be associated in the third lookup table 432 with PEC threshold 6, which, in the depicted example, are word line F, word line G, word line H, word line I, and word line J. And reliability-risk word lines that pose a significant reliability risk when a corresponding PEC count is more than PEC threshold 11 may be associated in the third lookup table 432 with PEC threshold 11, which, in the depicted example, are word line K, word line L, word line M, word line N, and word line O.

FIG. 4C is a diagram including an alternative depiction of the various operations described above in connection with FIGS. 4A and 4B. As shown in FIG. 4C, a memory device 120 may selectively implement one of multiple programming schemes (e.g., an nPnV programming scheme, a 1P0V programming scheme without a word line leakage monitoring procedure, a 1P0V programming scheme with a word line leakage monitoring procedure, a 1P1V programming scheme, or a similar programming scheme) based on a status of a word line being programmed. In the depicted example, the vertical axis is used to show various types of word lines, and the horizontal axis is used to indicate a PEC count associated with the corresponding word line.

As indicated by reference number 436, for DSV word lines and/or subblocks, the memory device 120 may use an nPnV programming scheme regardless of a PEC count. More particularly, the DSV word line and/or subblock may be used by the memory device 120 to establish a starting $V_{pgm}$, and thus the memory device 120 may be configured to perform the nPnV programming scheme for all DSV word lines and/or subblocks regardless of a corresponding PEC count (e.g., as described above in connection with reference numbers 404 and 406).

As indicated by reference number 438, for reliability-risk word lines (e.g., word lines determined to be reliability-risk word lines from DPM information or similar statistical information), a memory device 120 may selectively utilize a word line leakage monitoring procedure (e.g., a CPCM/WLSS procedure) based on a number of PECs associated with the word lines. For example, when a PEC count for a word line being programmed is below a corresponding PEC threshold, as indicated in FIG. 4C by reference number 440, the memory device 120 may perform a programming scheme that does not utilize a word line leakage monitoring procedure, such as a 1P0V programming scheme. However, when a PEC count for a word line being programmed satisfies the PEC threshold (e.g., is at or above the PEC threshold indicated by reference number 440), the memory device 120 may perform a programming scheme that utilizes a word line leakage monitoring procedure, such as a 1P0V programming scheme with a CPCM count and/or a WLSS check enabled.

As indicated by reference number 442, for other word lines (e.g., non-reliability-risk word lines, which may be word lines that are neither DSV word lines nor reliability-risk word lines), a memory device 120 may perform a programming scheme that does not utilize a word line leakage monitoring procedure, such as a 1P0V programming scheme. Moreover, in some implementations, for non-reliability-risk word lines, the memory device 120 may utilize a programming scheme that does not utilize a word line leakage monitoring procedure (e.g., a 1P0V programming scheme) only up to a specified PEC count, sometimes referred to as an endurance limit, as indicated in FIG. 4C using reference number 444. The endurance limit may be based on, or equal to, an expected operational lifetime of the memory device 120. For example, the endurance limit may be based on an expected PEC count at which the memory associated with the non-reliability-risk word lines are expected to not function as intended (e.g., no longer store data with a given degree of reliability).

In such implementations, the memory device 120 may selectively use one of multiple programming schemes for non-reliability-risk word lines based on whether a PEC count associated with the word line has reached the specified endurance limit. More particularly, for non-reliability-risk word lines with PEC counts below the endurance limit, the memory device 120 may perform a programming scheme that does not utilize a word line leakage monitoring procedure, such as a 1P0V programming scheme. For non-reliability-risk word lines with PEC counts at or above the endurance limit, the memory device 120 may perform a programming scheme that enables a word line leakage monitoring procedure, a verify operation, or some other procedure in order to ensure reliability of host data being written. For example, for word lines with PEC counts at or above the endurance limit, the memory device 120 may perform a programming scheme that uses a word line leakage monitoring procedure, such as a 1P0V programming scheme with a CPCM count and/or a WLSS check enabled, a programming scheme associated with a verify operation, such as a 1P1V programming scheme, or a similar programming scheme. In this way, the memory device 120 may improve overall memory device 120 performance and reduce power consumption, while maintaining reliability of the memory device 120 by selectively performing certain checks for reliability-risk word lines.

As indicated above, FIGS. 4A-4C are provided as an example. Other examples may differ from what is described with regard to FIGS. 4A-4C.

FIG. 5 is a flowchart of an example method 500 associated with selective use of a word line monitoring procedure for reliability-risk word lines. In some implementations, a memory device (e.g., the memory device 120) may perform or may be configured to perform the method 500. In some implementations, another device or a group of devices separate from or including the memory device (e.g., the system 100) may perform or may be configured to perform the method 500. Additionally, or alternatively, one or more components of the memory device (e.g., the controller 130, the memory management component 225, the reliability risk component 230, the programming component 235, and/or the word line leakage monitoring component 240) may perform or may be configured to perform the method 500. Thus, means for performing the method 500 may include the memory device and/or one or more components of the memory device. Additionally, or alternatively, a non-transitory computer-readable medium may store one or more instructions that, when executed by the memory device (e.g., the controller 130 of the memory device 120), cause the memory device to perform the method 500.

As shown in FIG. 5, the method 500 may include receiving, from a host device, an SLC program command instructing host data to be written to one or more subblocks of memory (block 510). As further shown in FIG. 5, the method 500 may include determining whether a word line is associated with a subblock, of the one or more subblocks, is associated with a reliability risk (block 520). As further shown in FIG. 5, the method 500 may include determining whether to perform a word line leakage monitoring procedure associated with a programming scheme to be used to program the subblock based on whether the word line is associated with the reliability risk (block 530).

The method 500 may include additional aspects, such as any single aspect or any combination of aspects described below and/or described in connection with one or more other methods or operations described elsewhere herein.

In a first aspect, the method 500 includes, based on determining that the word line is not associated with the reliability risk, performing a programming scheme associated with one programming pulse and zero verify operations without performing the word line leakage monitoring procedure.

In a second aspect, alone or in combination with the first aspect, the method 500 includes, based on determining that the word line is associated with the reliability risk, performing the word line leakage monitoring procedure in connection with a programming scheme associated with one programming pulse and zero verify operations.

In a third aspect, alone or in combination with one or more of the first and second aspects, the method 500 includes determining whether a PEC count associated with the word line satisfies a PEC threshold, wherein determining whether to perform the word line leakage monitoring procedure is further based on whether the PEC count satisfies the PEC threshold.

In a fourth aspect, alone or in combination with one or more of the first through third aspects, the method 500 includes determining whether a ganged verify programming scheme is to be used to program the subblock, wherein determining whether to perform the word line leakage monitoring procedure is further based on whether the ganged verify programming scheme is to be used to program the subblock.

In a fifth aspect, alone or in combination with one or more of the first through fourth aspects, the method 500 includes, based on determining that the word line is associated with the reliability risk, that the PEC count satisfies the PEC threshold, and that the ganged verify programming scheme is not to be used to program the subblock, performing the word line leakage monitoring procedure.

In a sixth aspect, alone or in combination with one or more of the first through fifth aspects, determining whether to perform the word line leakage monitoring procedure is based on a lookup table that associates one or more word lines associated with the reliability risk with one or more PEC thresholds.

Although FIG. 5 shows example blocks of a method 500, in some implementations, the method 500 may include additional blocks, fewer blocks, different blocks, or differently arranged blocks than those depicted in FIG. 5. Additionally, or alternatively, two or more of the blocks of the method 500 may be performed in parallel. The method 500 is an example of one method that may be performed by one or more devices described herein. These one or more devices may perform or may be configured to perform one or more other methods based on operations described herein.

Figure 6:
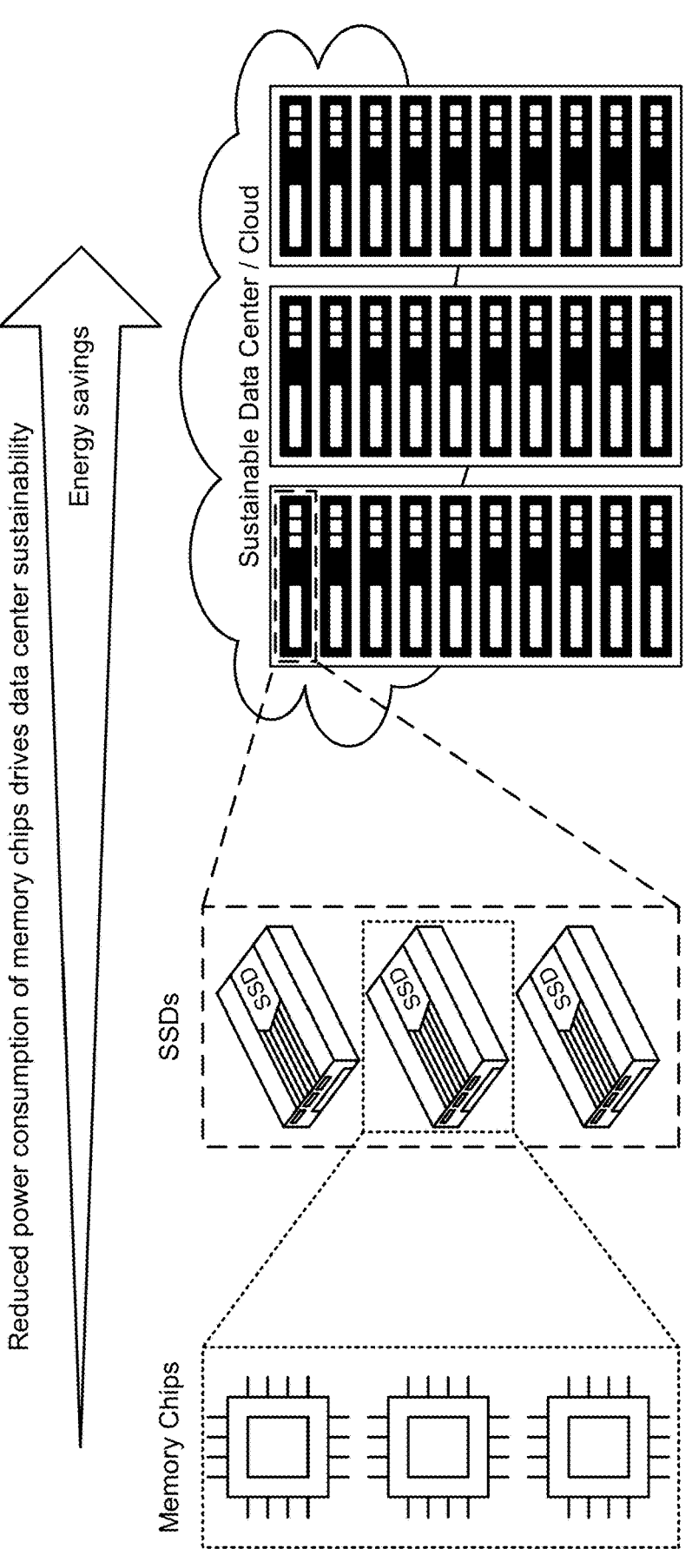
FIG. 6 is a diagram illustrating example systems in which the memory device described herein may be used.

FIG. 6 is a diagram illustrating example systems in which the memory device 120 described herein may be used. In some implementations, one or more memory devices 120 may be included in a memory chip. Multiple memory chips may be packaged together and included in a higher level system, such as an SSD or another type of memory drive. Each SSD may include, for example, up to five memory chips, up to ten memory chips, or more. A data center or cloud computing environment may include multiple SSDs to store a large amount of data. For example, a data center may include hundreds, thousands, or more SSDs.

As described above, some implementations described herein reduce power consumption of a memory device 120. As shown in FIG. 6, this reduced power consumption drives data center sustainability and leads to energy savings because of the large volume of memory devices 120 included in a data center.

As indicated above, FIG. 6 is provided as an example. Other examples may differ from what is described with regard to FIG. 6.

In some implementations, a memory device includes one or more components configured to: receive, from a host device, an SLC program command instructing the memory device to write host data to a one or more subblocks of memory: determine whether a word line associated with a subblock, of the one or more subblocks, is associated with a reliability risk; and determine whether to perform a word line leakage monitoring procedure associated with a programming scheme to be used to program the subblock based on whether the word line is associated with the reliability risk.

In some implementations, a method includes receiving, from a host device, an SLC program command instructing host data to be written to one or more subblocks of memory: determining whether a word line associated with a subblock, of the one or more subblocks, is associated with a reliability risk; and determining whether to perform a word line leakage monitoring procedure associated with a programming scheme to be sued to program the subblock based on whether the word line is associated with the reliability risk.

In some implementations, a memory device includes a memory: a controller operatively coupled to the memory and configured to: receive, from a host device, an SLC program command instructing the memory device to write host data to one or more subblocks of the memory: determine whether a word line associated with a subblock, of the one or more subblocks, is associated with a reliability risk: determine whether a PEC count associated with the word line satisfies a PEC threshold; and determine whether to perform a word line leakage monitoring procedure associated with a programming scheme to be used to program the subblock based on whether the word line is associated with the reliability risk and whether the PEC count satisfies the PEC threshold.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

When "a component" or "one or more components" (or another element, such as "a controller" or "one or more controllers") is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X; perform Y; and perform Z," that claim should be interpreted to mean "one or more components configured to perform X; one or more (possibly different) components configured to perform Y; and one or more (also possibly different) components configured to perform Z."

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
one or more components configured to:
    receive, from a host device, a single-level cell (SLC) program command instructing the memory device to write host data to one or more subblocks of memory;
    determine whether a word line associated with a subblock, of the one or more subblocks, is associated with a reliability risk;
    determine whether to perform a word line leakage monitoring procedure associated with a programming scheme to be used to program the subblock based on whether the word line is associated with the reliability risk; and
    perform, based on determining that the word line is not associated with the reliability risk, a programming scheme associated with one programming pulse and zero verify operations without performing the word line leakage monitoring procedure.

2. The memory device of claim 1, wherein the one or more components are further configured to, based on determining that the word line is associated with the reliability risk, perform the word line leakage monitoring procedure in connection with a programming scheme associated with one programming pulse and zero verify operations.

3. The memory device of claim 1, wherein the one or more components are further configured to determine whether a program-erase cycle (PEC) count associated with the word line satisfies a PEC threshold, and
    wherein determining whether to perform the word line leakage monitoring procedure is further based on whether the PEC count satisfies the PEC threshold.

4. The memory device of claim 3, wherein the one or more components are further configured to determine whether a ganged verify programming scheme is to be used to program the subblock, and
    wherein determining whether to perform the word line leakage monitoring procedure is further based on whether the ganged verify programming scheme is to be used to program the subblock.

5. The memory device of claim 4, wherein the one or more components are further configured to, based on determining that the word line is associated with the reliability risk, that the PEC count satisfies the PEC threshold, and that the ganged verify programming scheme is not to be used to program the subblock, perform the word line leakage monitoring procedure.

6. The memory device of claim 1, wherein determining whether to perform the word line leakage monitoring procedure is based on a lookup table that associates one or more word lines associated with the reliability risk with one or more PEC thresholds.

7. The memory device of claim 1, wherein the one or more components are further configured to determine whether to perform the word line leakage monitoring procedure is further based on whether a program-erase cycle (PEC) count satisfies a PEC threshold, the PEC threshold corresponding to a least reliable word line of the subblock.

8. A method, comprising:
receiving, from a host device, a single-level cell (SLC) program command instructing host data to be written to one or more subblocks of memory;
determining whether a word line associated with a subblock, of the one or more subblocks, is associated with a reliability risk;
determining whether to perform a word line leakage monitoring procedure associated with a programming scheme to be used to program the subblock based on whether the word line is associated with the reliability risk; and
perform, based on determining that the word line is associated with the reliability risk, the word line leakage monitoring procedure in connection with a programming scheme associated with one programming pulse and zero verify operations.

9. The method of claim 8, further comprising, based on determining that the word line is not associated with the reliability risk, performing a programming scheme associated with one programming pulse and zero verify operations without performing the word line leakage monitoring procedure.

10. The method of claim 8, wherein determining whether to perform the word line leakage monitoring procedure is further based on whether a program-erase cycle (PEC) count satisfies a PEC threshold, the PEC threshold corresponding to a least reliable word line of the subblock.

11. The method of claim 8, further comprising determining whether a program-erase cycle (PEC) count associated with the word line satisfies a PEC threshold,
    wherein determining whether to perform the word line leakage monitoring procedure is further based on whether the PEC count satisfies the PEC threshold.

12. The method of claim 11, further comprising determining whether a ganged verify programming scheme is to be used to program the subblock, wherein determining whether to perform the word line leakage monitoring procedure is further based on whether the ganged verify programming scheme is to be used to program the subblock.

13. The method of claim 12, further comprising, based on determining that the word line is associated with the reliability risk, that the PEC count satisfies the PEC threshold, and that the ganged verify programming scheme is not to be used to program the subblock, performing the word line leakage monitoring procedure.

14. The method of claim 8, wherein determining whether to perform the word line leakage monitoring procedure is based on a lookup table that associates one or more word lines associated with the reliability risk with one or more PEC thresholds.

15. A memory device, comprising:

a memory;

a controller operatively coupled to the memory and configured to:

receive, from a host device, a single-level cell (SLC) program command instructing the memory device to write host data to one or more subblocks of the memory;

determine whether a word line associated with a subblock, of the one or more subblocks, is associated with a reliability risk;

determine whether a program-erase cycle (PEC) count associated with the word line satisfies a PEC threshold; and determine whether to perform a word line leakage monitoring procedure associated with a programming scheme to be used to program the subblock based on whether the word line is associated with the reliability risk and whether the PEC count satisfies the PEC threshold.

16. The memory device of claim 15, wherein the controller is further configured to, based on determining that at least one of the word line is not associated with the reliability risk or the PEC count does not satisfy the PEC threshold, perform a programming scheme associated with one programming pulse and zero verify operations without performing the word line leakage monitoring procedure.

17. The memory device of claim 15, wherein the controller is further configured to, based on determining that the word line is associated with the reliability risk and that the PEC count satisfies the PEC threshold, perform the word line leakage monitoring procedure in connection with a programming scheme associated with one programming pulse and zero verify operations.

18. The memory device of claim 15, wherein the controller is further 18. configured to determine whether a ganged verify programming scheme is to be used to program the subblock, and wherein determining whether to perform the word line leakage monitoring procedure is further based on whether the ganged verify programming scheme is to be used to program the subblock.

19. The memory device of claim 18, wherein the controller is further configured to, based on determining that the word line is associated with the reliability risk, that the PEC count satisfies the PEC threshold, and that the ganged verify programming scheme is not to be used to program the subblock, perform the word line leakage monitoring procedure.

20. The memory device of claim 15, wherein determining whether to perform the word line leakage monitoring procedure is based on a lookup table that associates one or more word lines associated with the reliability risk with one or more PEC thresholds.

* * * * *